US009548324B2

(12) United States Patent
Li et al.

(10) Patent No.: US 9,548,324 B2
(45) Date of Patent: Jan. 17, 2017

(54) ARRAY SUBSTRATE AND METHOD FOR FABRICATING THE SAME

(71) Applicant: BOE TECHNOLOGY GROUP CO., LTD., Beijing (CN)

(72) Inventors: Yanzhao Li, Beijing (CN); Gang Wang, Beijing (CN); Dongfang Wang, Beijing (CN); Wei Liu, Beijing (CN); Jingang Fang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/430,310

(22) PCT Filed: May 12, 2014

(86) PCT No.: PCT/CN2014/077285
§ 371 (c)(1),
(2) Date: Mar. 23, 2015

(87) PCT Pub. No.: WO2015/096350
PCT Pub. Date: Jul. 2, 2015

(65) Prior Publication Data
US 2016/0027819 A1    Jan. 28, 2016

(30) Foreign Application Priority Data
Dec. 27, 2013 (CN) .......................... 2013 1 0741939

(51) Int. Cl.
*H01L 27/12* (2006.01)
*H01L 29/786* (2006.01)
*H01L 21/027* (2006.01)

(52) U.S. Cl.
CPC ....... *H01L 27/1288* (2013.01); *H01L 21/0274* (2013.01); *H01L 29/786* (2013.01); *H01L 2924/0002* (2013.01)

(58) Field of Classification Search
CPC .......... H01L 27/3244; H01L 27/326–27/3262; H01L 27/3276–27/3279; H01L 27/1288; H01L 21/0274
See application file for complete search history.

(56) References Cited

U.S. PATENT DOCUMENTS 7,790,526 B2    9/2010  Tseng
7,903,188 B2 *  3/2011  Yang ..................... G02F 1/1368
                                                          349/43

(Continued)

FOREIGN PATENT DOCUMENTS

CN       1560901 A       1/2005
CN     101154346 A       4/2008

(Continued)

OTHER PUBLICATIONS

Written Opinion of the International Searching Authority for PCT/CN2014/077285 Mailed on Oct. 9, 2014 (in Chinese With English Language Translation Enclosed).

(Continued)

*Primary Examiner* — Stephen W Smoot
*Assistant Examiner* — Sun M Kim
(74) *Attorney, Agent, or Firm* — Collard & Roe, P.C.

(57) ABSTRACT

An array substrate and a method for fabricating the same are disclosed. The method includes steps of providing a substrate (20), a first metal layer including patterns of gate electrodes (21, 24) of a first and second TFTs, an active layer (27) and a gate insulation layer (28) are formed on the substrate; forming an etch stop layer film and a photoresist sequentially on the substrate (20), and allowing the photoresist to form a first, second and third regions through gray-scale exposing and developing; forming a pattern of an etch stop layer (29), a connection via hole (30), and a contact via hole (31) respectively in the first, second and third regions through a patterning process; and forming source electrodes and drain electrodes (22, 23,25, 26) of the first (Continued)

and second TFTs. Photoresist of different thicknesses are disposed according to etch depths, thereby avoiding the over-etch of relatively shallow via holes.

10 Claims, 4 Drawing Sheets

(56) References Cited

U.S. PATENT DOCUMENTS

| | | | |
|---|---|---|---|
| 2006/0044232 A1* | 3/2006 | Choi | H01L 27/3244 345/76 |
| 2013/0134425 A1 | 5/2013 | Chung et al. | |
| 2014/0005799 A1* | 1/2014 | Otten | A61F 2/604 623/33 |
| 2014/0077203 A1 | 3/2014 | Yuan | |
| 2014/0077211 A1* | 3/2014 | Xi | H01L 27/1225 257/59 |

FOREIGN PATENT DOCUMENTS

| | | |
|---|---|---|
| CN | 101369077 A | 2/2009 |
| CN | 101546733 A | 9/2009 |
| CN | 101916039 A | 12/2010 |
| CN | 102646633 A | 8/2012 |
| CN | 102651401 A | 8/2012 |
| CN | 102768992 A | 11/2012 |
| CN | 103715141 A | 4/2014 |

OTHER PUBLICATIONS

International Search Report of the International Searching Authority for PCT/CN2014/077285 Mailed on Oct. 9, 2014 (in Chinese).
Chinese Office Action of Chinese Application No. 201310741939.9, mailed Sep. 19, 2014 with English translation.

* cited by examiner

ARRAY SUBSTRATE AND METHOD FOR FABRICATING THE SAME

FIELD OF THE ART

Embodiments of the invention relate to an AMOLED array substrate and a method for fabricating the AMOLED array substrate.

BACKGROUND

Active Matrix Organic Light Emitting Diode (AMOLED) displays have the advantages of self-luminous, wide viewing-angle, high contrast ratio, thin and compact as well as low power consumption and are currently one of the most interested flat panel display technologies. An AMOLED array substrate generally has a 2T1C (two Thin Film Transistors (TFTs) and one capacitor) configuration or a 6T2C (six TFTs and two capacitors) configuration with a complementary structure, wherein an active layer of the TFT is made of amorphous silicon, low temperature poly-silicon (LTPS), or an oxide semiconductor material such as IGZO. Taking the 2T1C configuration as an example, in a pixel unit, one of the two TFTs functions as the switch TFT and the other TFT functions as the drive TFT; the drain electrode of the switch TFT is electrically connected to the gate electrode of the drive TFT by way of a contact via hole. A current flowing through the drive TFT is adjusted by controlling a gate voltage of the drive TFT (i.e., a drain voltage of the switch TFT), thereby further controlling luminance of an organic light emitting layer corresponding to each of the pixel units.

SUMMARY

Embodiments of the invention provide an array substrate and a method for fabricating the same.

One aspect of the invention provides a method for fabricating an array substrate, comprising:

providing a substrate, wherein a first metal layer, a gate insulation layer and an active layer are formed on the substrate, and the first metal layer comprises patterns of a gate electrode of a first TFT and a gate electrode of a second TFT;

forming an etch stop layer film on the substrate;

applying a photoresist to the etch stop layer, gray-scale exposing and developing the photoresist to form a first region having a first thickness, a second region having a second thickness and a third region having a third thickness, wherein the first thickness, the second thickness and the third thickness are not equal to each other, and the first thickness is larger than the second and third thicknesses;

forming, through a patterning process, a pattern of an etch stop layer in the first region, a connection via hole for connecting a drain electrode of the first TFT to a gate electrode of the second TFT in the second region, and a contact via hole for connecting respective source electrode and drain electrode of each of the first and second TFTs in the third region to the active layer; and forming a second metal layer film on the substrate done with the previous steps, forming a source electrode and a drain electrode of the first TFT as well as a source electrode and a drain electrode of the second TFT, wherein the source electrode and the drain electrode of each of the first and second TFTs are respectively electrically connected to the active layer by way of the contact via hole, and the drain electrode of the first TFT is electrically connected to the gate electrode of the second TFT by way of the connection via hole.

As an example, the first and second TFTs are bottom-gate TFTs.

As an example, the formation of the first metal layer, the gate insulation layer and the active layer comprises:

forming a first metal film on the provided substrate, and forming a pattern of a gate electrode metal layer comprising the gate electrode of the first TFT and that of the second TFT through a patterning process;

forming the gate insulation layer on the substrate done with the previous step; and forming an active layer film on the substrate done with the previous step and forming a pattern comprising the active layer through a patterning process.

As an example, the third thickness is larger than the second thickness, and the second thickness may be 0.

As an example, the pattern of the etch stop layer is formed from the etch stop layer film under the first region.

As an example, the connection via hole is formed in the etch stop layer film and the gate insulation layer under the second region and penetrates through the etch stop layer film and the gate insulation layer.

As an example, the contact via hole is formed in the etch stop layer film under the third region and penetrates through the etch stop layer film.

As an example, both the first TFT and the second TFT are top-gate TFTs.

As an example, the formation of the pattern comprising the first metal layer, the active layer and the gate insulation layer comprises:

forming an active layer film on the provided substrate, and forming a pattern of the active layer through a patterning process;

forming the gate insulation layer on the substrate done with the previous step; and forming a first metal film on the substrate done with the previous step, and forming a pattern of a gate electrode metal layer comprising the gate electrode of the first TFT and that of the second TFT through a patterning process.

As an example, the second thickness is larger than the third thickness, and the third thickness may be 0.

As an example, the step of gray-scale exposing and developing the photoresist to form a first region having a first thickness, a second region having a second thickness and a third region having a third thickness comprises:

exposing the photoresist to form the first region, the second region and the third region by utilizing a gray-scale exposing light source, a plurality of light sources with different exposure intensities and a plurality of masks.

As an example, the pattern of the etch stop layer is formed from the etch stop layer film under the first region.

As an example, the connection via hole is formed in the etch stop layer film under the second region and penetrates through the etch stop layer film.

As an example, the contact via hole is formed in the etch stop layer film and the gate insulation layer under the third region and penetrates through the etch stop layer film and the gate insulation layer.

A second aspect of the invention provides an array substrate fabricated according to the above methods.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In an AMOLED display device employing bottom-gate TFTs, such as one with a 2T1C configuration, one of the two TFTs in a pixel unit functions as a switch TFT and the other functions as a drive TFT, with the drain electrode of the switch TFT being electrically connected to the gate electrode of the drive TFT by way of a contact via hole. In an AMOLED back plate (i.e., an array substrate) of a conventional AMOLED display device, a connection via hole generally configured for connecting the drain electrode of the switch TFT and the gate electrode of the drive TFT is simultaneously etched with contact via holes respectively connecting a source/drain metal of the two TFTs to respective active layer. An etching depth of the connection via hole above the gate electrode of the drive TFT (greater than or equal to a sum of a thickness of the etch stop layer and that of a gate insulation layer) is much larger than that of the contact via hole which connects the source/drain electrode and the active layer. Due to the above fact, when the etching depth of the connection via hole meets the requirement, it is likely that the contact via hole connecting the source/drain metal and the active layer in a single TFT is over etched as the etching time is far too long, causing the active layer and the gate insulation layer to break. Furthermore, when a source/drain metal film is deposited following the etching of the contact via hole, the source/drain metal and the gate metal will form an electrical connection at the broken part of the active layer and the gate insulation layer, which will eventually cause serious current leakage or even failure of the array substrate, decreasing the defect-free rate.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
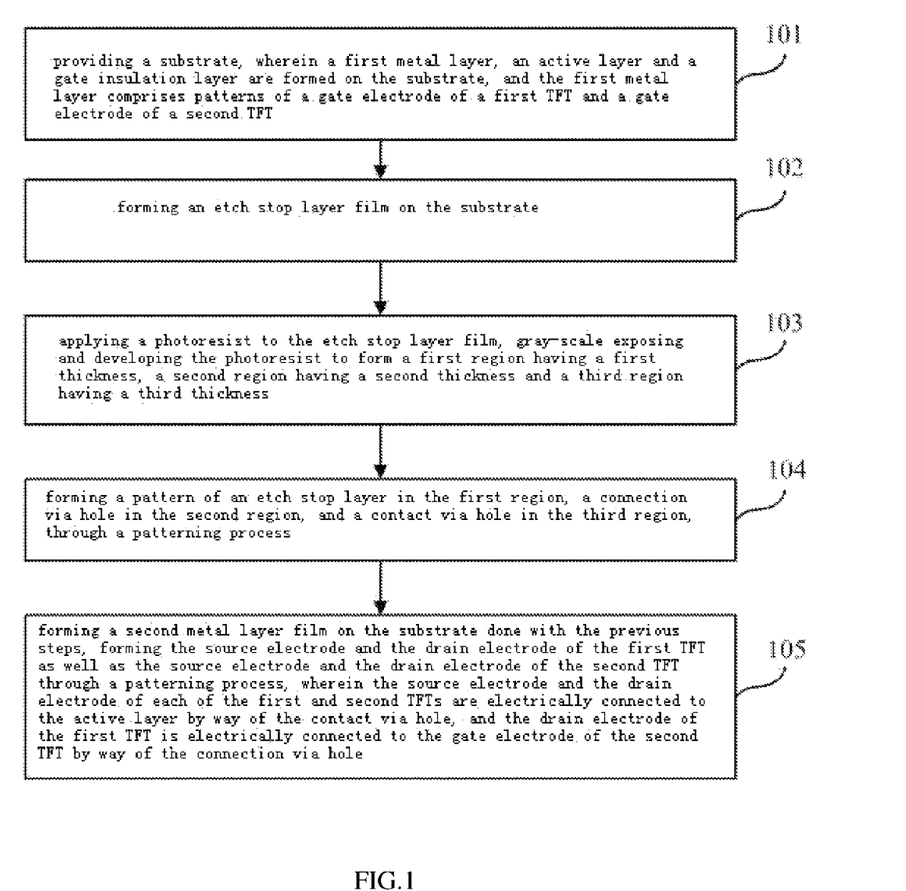
FIG. 1 schematically illustrates a flow chart of a method for fabricating a TFT in an AMOLED in accordance with an embodiment of the invention.

With reference to FIG. 1, an embodiment of the invention provides a method for fabricating an AMOLED array substrate, comprising the following steps:

101. providing a substrate, wherein a first metal layer, an active layer and a gate insulation layer are formed on the substrate, and the first metal layer comprises patterns of a gate electrode of a first TFT and a gate electrode of a second TFT.

102. forming an etch stop layer film on the substrate.

103. applying a photoresist to the etch stop layer film, gray-scale exposing and developing the photoresist to form a first region having a first thickness, a second region having a second thickness and a third region having a third thickness.

As an example, the first thickness, the second thickness and the third thickness are not equal to each other, and the first thickness is larger than the second and third thicknesses. The second thickness is set according to a required etching depth of the connection via hole and in inverse proportion to the required etching depth of the connection via hole. The third thickness is set according to a required etching depth of the contact via hole and in inverse proportion to the required etching depth of the contact via hole. In this sense, the larger the etching depth of the connection via hole or the contact via hole is, the smaller is the corresponding second or third thickness. Those skilled in the art will understand that the first thickness of the photoresist formed in the first region is the largest, therefore the etching depth in the first region is the smallest.

It is noted that, the contact via holes in this embodiment are formed in the etch stop layer during the fabricating process and configured as via holes for contacting the source/drain electrodes of the first TFT and the second TFT with their respective active layers. Those skilled in the art will understand that the source and drain electrode in each TFT can directly contact the active layer, after the first TFT and the second TFT are finished. Usually, the contact via hole may be fabricated in the etch stop layer film above the source electrode and the drain electrode. Alternatively, the contact via hole may be formed by retaining the etch stop layer film above the active layer while removing the etch stop layer films in other regions. However, the solution according to the embodiment of the invention is suitable for but not limited to the above two implementations. It is noted that, in a bottom-gate TFT as illustrated in FIG. 3B, the contact via hole connecting the source electrode and the drain electrode of the TFT with the active layer is not illustrated clearly in the finished TFT.

104. forming a pattern of an etch stop layer in the first region, a connection via hole in the second region, and a contact via hole in the third region, through a patterning process.

As an example, the pattern of the etch stop layer is formed in a part of the etch stop layer film under the first region. The connection via hole, which connects the drain electrode of the first TFT to the gate electrode of the second TFT, is formed in a part of the etch stop layer film under the second region. The contact via hole, which respectively connects the source electrode and the drain electrode of each of the first and the second TFTs to respective active layers, is formed in a part of the etch stop layer film under the third region.

105. forming a second metal layer film on the substrate done with the previous steps, forming the source electrode and the drain electrode of the first TFT as well as the source electrode and the drain electrode of the second TFT through a patterning process, wherein the source electrode and the drain electrode of each of the first and second TFTs are electrically connected to the active layer by way of the contact via hole, and the drain electrode of the first TFT is electrically connected to the gate electrode of the second TFT by way of the connection via hole.

As an example, the first and second TFTs are bottom-gate TFTs, and the third thickness is greater than the second thickness.

As an example, the step of forming the pattern comprising the first metal layer, the active layer and the gate insulation layer, during the process of fabricating the first and second bottom-gate TFTs, comprises:

forming a first metal film on the provided substrate, and forming a pattern of a gate metal layer comprising the gate electrodes of the first and second TFTs through a patterning process;

forming a gate insulation layer on the substrate done with the previous step;

forming an active layer film on the substrate done with the previous steps, and forming a pattern comprising the active layer by way of a patterning process.

As an example, during the fabrication procedure of the first and second TFTs, the second thickness is 0.

As an example, the first and second TFTs are top-gate TFTs and the second thickness is greater than the third thickness.

As an example, the step of forming the pattern comprising the first metal layer, the active layer and the gate insulation layer, during the fabrication procedure of the first and second top-gate TFTs, comprises:

forming an active layer film on the provided substrate, and forming a pattern comprising the active layer through a patterning process;

forming a gate insulation layer on the substrate done with the previous step;

forming a first metal film on the substrate done with the previous steps, and forming a pattern of a gate metal layer comprising the gates of both the first and second TFTs through a patterning process.

As an example, during the fabrication procedure of the first and second top-gate TFTs, the third thickness is 0.

As an example, the step of gray-scale exposing and developing the photoresist to form a first region having a first thickness, a second region having a second thickness and a third region having a third thickness, comprises:

exposing the photoresist to form the first region, the second region and the third region by utilizing a gray-scale exposing light source, or a plurality of light sources with different exposure intensities, or a plurality of masks.

The embodiment of the invention has the following advantageous effects: during the fabricating procedure of the array substrate, photoresist of different thicknesses is applied to positions corresponding to different via holes, in accordance with different etching depths of the connection via hole connecting the drain electrode of the switch TFT to the gate electrode of the drive TFT and the contact via hole connecting the source/drain electrode of the TFTs to the active layer, to prevent the over etching of via holes with smaller depth. As a result, current leakage caused by the electrical connection between the source/drain electrode metal and the gate electrode metal due to the break of the active layer and gate insulation layer caused by over etching is prevented, thereby increasing the defect-free rate of TFT fabrication.

Figure 2:
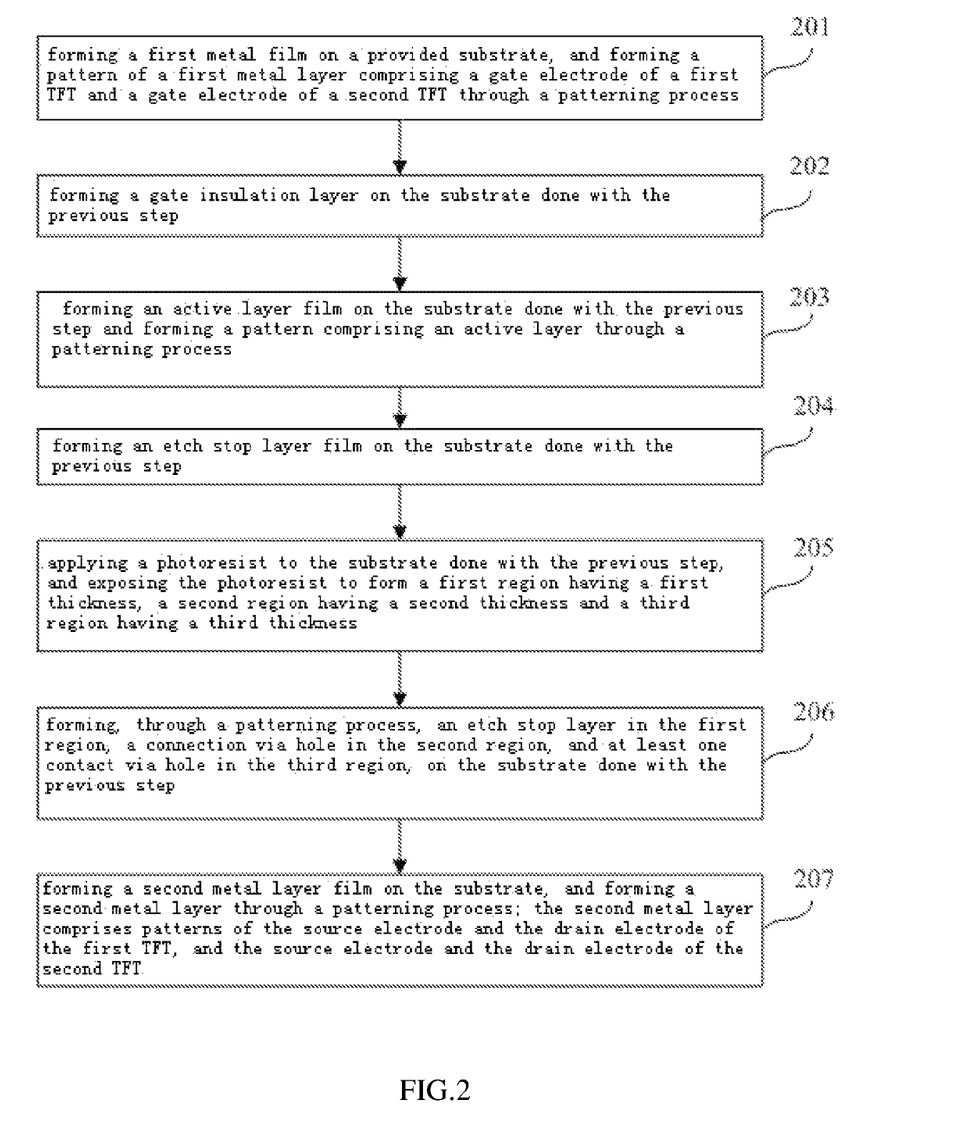
FIG. 2 schematically illustrates a flow chart of a method for fabricating a bottom-gate TFT in accordance with an embodiment of the invention.

With reference to FIG. 2, an embodiment of the invention provides a method for fabricating an AMOLED array substrate, comprising the following steps:

201. forming a first metal film on a provided substrate, and forming a pattern of a first metal layer comprising a gate electrode of a first TFT and a gate electrode of a second TFT through a patterning process;

202. forming a gate insulation layer on the substrate done with the previous step;

203. forming an active layer film on the substrate done with the previous step and forming a pattern comprising an active layer through a patterning process;

204. forming an etch stop layer film on the substrate done with the previous step;

205. applying a photoresist to the substrate done with the previous step, and exposing the photoresist to form a first region having a first thickness, a second region having a second thickness and a third region having a third thickness, wherein the first region corresponds to a position of the gate electrode of the first TFT, the second region corresponds to a position of the gate electrode of the second TFT; the first thickness is greater than the third thickness, and the third thickness is greater than the second thickness.

As an example, the second thickness may be zero. That is, the photoresist in the second region is completely removed.

206. forming, through a patterning process, an etch stop layer in the first region, a connection via hole in the second region, and at least one contact via hole in the third region, on the substrate done with the previous step.

207. forming a second metal layer film on the substrate done with the previous steps, and forming a second metal layer through a patterning process; the second metal layer comprises patterns of the source electrode and the drain electrode of the first TFT, and the source electrode and the drain electrode of the second TFT, wherein both the source electrode and the drain electrode of each of the first and second TFTs are electrically connected to the active layer, and the drain electrode of the first TFT is electrically connected to the gate electrode of the second TFT by way of the connection via hole; thereby forming the first and the second TFTs.

It is noted that, the first and the second TFTs may be the two TFTs of 2T1C (two TFTs and one capacitor) configuration or two specific TFTs of 6T2C (six TFTs and two capacitors) configuration. The 6T2C configuration may be easily obtained by those skilled in the art according to the embodiment of the invention and will not be described herein.

Alternatively, the step 201 may comprise: forming a first metal film on the provided substrate through a sputtering or depositing process, and forming the pattern of the first metal layer comprising the gate electrodes of the first and the second TFTs by way of photolithograph.

Alternatively, the step 202 may comprise: forming a gate insulation layer on the substrate done with the previous step through CVD. As an example, a material of the gate insulation layer may be SiO2 or SiNx, with a thickness of 1 to 300 nanometers.

Alternatively, the step 203 may comprise: forming an IGZO film on the substrate done with previous step through magnetron sputtering, and forming the pattern comprising the active layer with a thickness of 5 to 200 nm through photolithograph.

Alternatively, the step 204 may comprise: depositing an etch stop layer film on the substrate done with previous step through CVD sputtering. As an example, a material of the etch stop layer film may be SiO2 or SiNx with a thickness of 5 to 500 nanometers.

Alternatively, the step 205 may comprise: applying a photoresist to the substrate done with the previous step, and exposing the photoresist to form the first region, the second region and the third region by utilizing a gray-scale exposing light source, a plurality of light sources with different exposure intensities, or a plurality of masks. "The gray-scale exposing light source" is a single exposing light source configured as emitting light having different exposure intensities in different regions; "a plurality of light sources with different exposure intensities" is a plurality of light sources having different exposure intensities from each other.

Alternatively, the step 206 may comprise: forming a pattern of the etch stop layer in the first region, the connection via hole in the second region, and at least one contact via hole in the third region, on the substrate done with the previous step through a dry etching process.

Alternatively, the step 207 may comprise: forming, on the substrate done with the previous step, a second metal layer film through sputtering, and forming a pattern of a source/drain metal layer comprising the source electrodes of the first and second TFTs and the drain electrodes of the first and second TFTs through photolithograph, wherein the drain electrode of the first TFT is connected to the gate electrode of the second TFT by way of a connection via hole, thereby forming the first TFT and the second TFT.

Optionally, the first and second metal layers in the embodiment may be made of a material selected from Mo, Al, Cr, Au and Ti, or a compound metal layer of two or more materials selected therefrom, with a thickness of 1 to 500 nanometers.

Figure 3A:
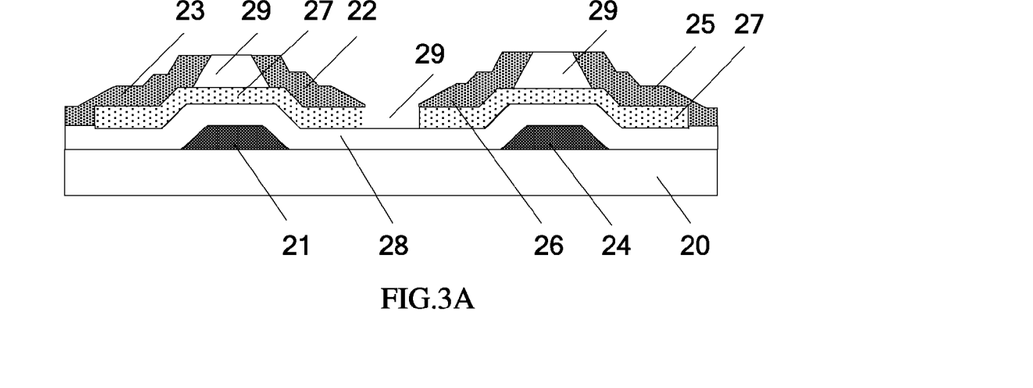
FIGS. 3A and 3B are cross sections of a bottom-gate TFT in accordance with an embodiment of the invention.
Figure 3B:
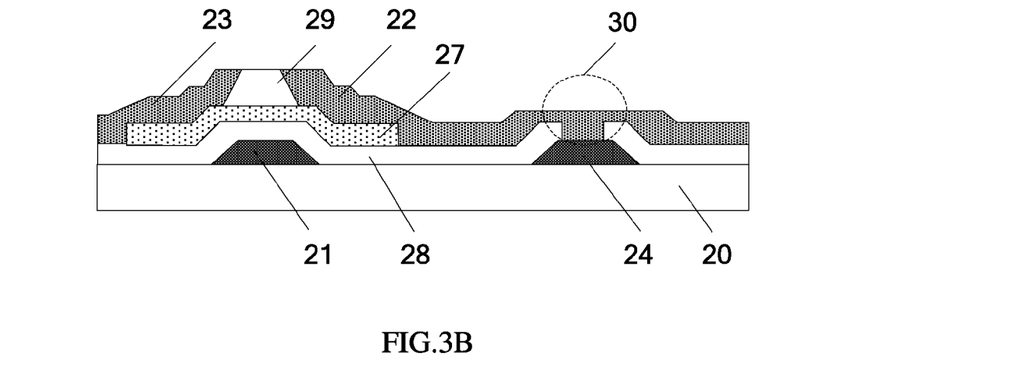

An array substrate with a 2T1C configuration fabricated according to the embodiment of the invention is illustrated in FIG. 3A and FIG. 3B (cross sections taken along different directions are illustrated). The array substrate comprises a first and second TFTs, both of which being bottom-gate TFTs. The array substrate comprises a substrate 20, a gate electrode 21, a drain electrode 22 and a source electrode of the first TFT, and a gate electrode 24, a drain electrode 25 and a source electrode 26 of the second TFT. The array substrate further comprises a via hole 30 formed above the gate electrode 24 (or an extension thereof) of the second TFT, while the drain electrode 22 of the first TFT is electrically connected to the gate electrode 24 of the second TFT by way of the via hole 30. Each of the drain electrode 22, the source electrode 23, the drain electrode 25 and the source electrode 26 is electrically connected to an active layer 27. The array substrate further comprises a gate insulation layer 28 and an etch stop layer 29.

Figure 5:
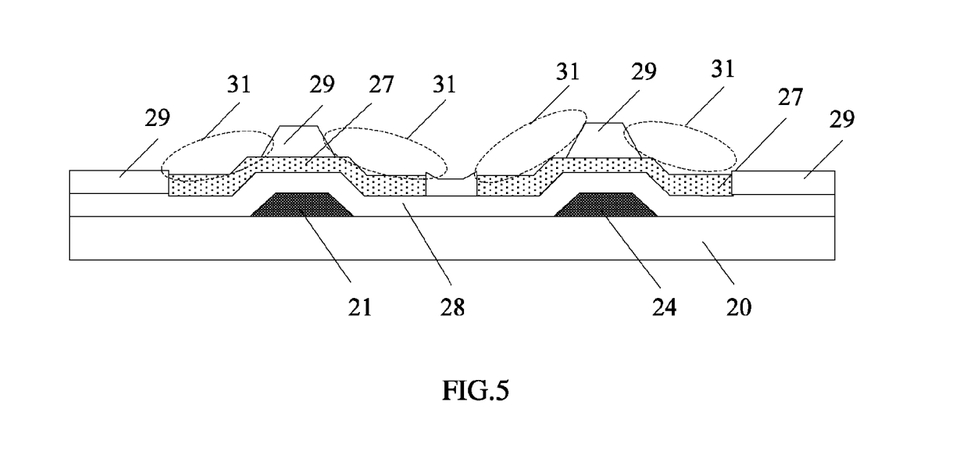
FIG. 5 is a cross section of the bottom-gate TFT, when a source electrode and a drain electrode are not formed, as illustrated in FIG. 3A in accordance with an embodiment of the invention.

It is seen from FIG. 3A and FIG. 3B that the etching depth of the connection via hole 30 electrically connecting the drain electrode 22 of the first TFT to the gate electrode 24 of the second TFT is the largest, therefore, the exposed photoresist there is of the second thickness in the fabrication method. The etching depth of a contact via hole 31, which electrically connects the drain electrode 22, the source electrode 23, the drain electrode 25 and the source electrode 26 to the active layer 27, is the second largest. FIG. 5 is a cross section of the array substrate having a 2T1C configuration illustrated in FIG. 3A, when the drain electrode 22, the source electrode 23, the drain electrode 25 and the source electrode 26 are not formed. The etching depth of the contact via hole 31 is smaller than that of the connection via hole 30. The depth of the exposed photoresist at the contact via hole 31 is the third thickness. The depth of the exposed photoresist at the position corresponding to the gate electrode 21 and other positions with no need of forming via holes is the first thickness.

During the fabricating procedure of the array substrate, photoresist of different thicknesses is applied to positions corresponding to different via holes, in accordance with different etching depths of the connection via hole connecting the drain electrode of the first TFT (the switch TFT) to the gate electrode of the second TFT (the drive TFT) and the contact via hole connecting the source/drain electrode of the TFT to the active layer, to prevent the over etching of via holes with smaller depth. As a result, current leakage caused by the electrical connection between the source/drain electrode metal and the gate electrode metal due to the break of the active layer and gate insulation layer caused by over etching is prevented, thereby increasing the defect-free rate of TFT fabrication.

An embodiment of the invention provides another method for fabricating an AMOLED array substrate with a 2T1C configuration and comprising a first and second TFTs both being top-gate TFTs. The method comprises the following steps:

301. forming an active layer film on the substrate, and forming a pattern comprising an active layer through a patterning process.

302. forming a gate insulation layer on the substrate done with the previous step.

303. forming a first metal film on the substrate done with the previous step, and forming a pattern of a gate electrode metal layer comprising a gate electrode of the first TFT and a gate electrode of the second TFT through a patterning process.

304. forming an etch stop layer film on the substrate done with the previous step.

305. applying a photoresist to the substrate done with the previous step, exposing the photoresist to form a first region having a first thickness, a second region having a second thickness and a third region having a third thickness, wherein the first region corresponds to the gate electrode of the first TFT, the second region corresponds to the gate electrode of the second TFT, and the third region corresponds to the source/drain electrode of the first and second TFTs; the first thickness is larger than the second thickness, and the second thickness is larger than the third thickness.

As an example, the third thickness may be zero, i.e., the photoresist in the third region is removed completely.

306. forming, through an etching process, an etch stop layer in the first region, a connection via hole in the second region, and at least one contact via hole in the third region, on the substrate done with the previous step.

307. forming a second metal layer film on the substrate done with the previous steps, forming a second metal layer through a patterning process, the second metal layer comprises patterns of the source electrode and the drain electrode of the first TFT, and the source electrode and the drain electrode of the second TFT, wherein the source electrode and the drain electrode of each of the first and second TFTs are respectively electrically connected to the active layer, and the drain electrode of the first TFT is electrically connected to the gate electrode of the second TFT by way of the connection via hole, thereby forming the first and the second TFTs.

As an example, the method further comprises the step of forming a buffer layer on the substrate before the step 301, wherein a material of the buffer layer may be $SiO_2$ or $SiN_x$, with a thickness of 1 to 200 nanometers.

For materials and thicknesses of individual layers in the embodiment please refer to the materials and thicknesses of individual layers in the above bottom-gate TFTs, and will not be elaborated herein.

Figure 4A:
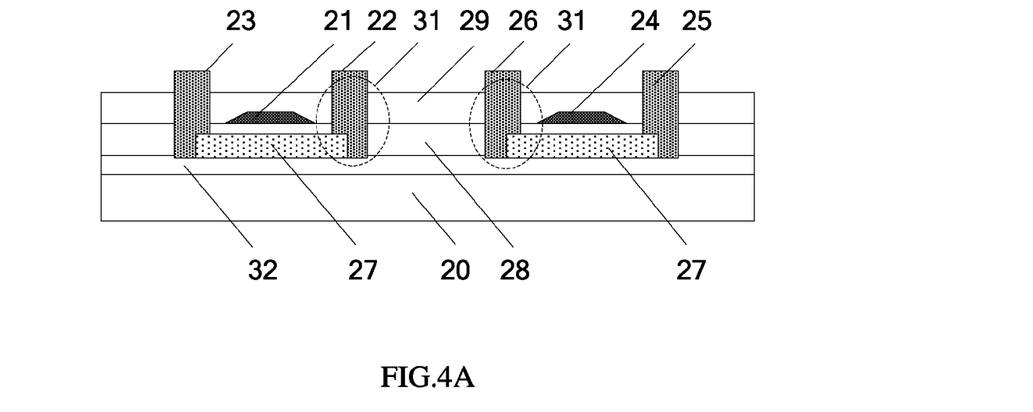
FIGS. 4A and 4B are cross sections of a top-gate TFT in accordance with an embodiment of the invention.
Figure 4B:
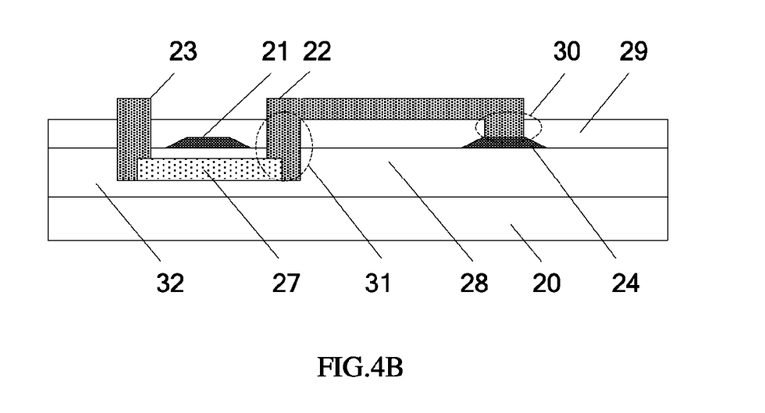

The array substrate having a 2T1C configuration fabricated in accordance with the embodiment is illustrated in FIG. 4A and FIG. 4B (cross sections taken along different directions are illustrated). The array substrate comprises a first and second TFTs both being bottom-gate TFTs. The array substrate comprises: a substrate 20, a buffer layer 32, a gate electrode 21, a drain electrode 22 and a source electrode 23 of the first TFT, a gate electrode 24, a drain electrode 25 and a source electrode 26 of the second TFT. In the array substrate, the drain electrode 22 of the first TFT is electrically connected to the gate electrode 24 of the second TFT, and each of the drain electrode 22, the source electrode 23, the drain electrode 25 and the source electrode 26 is electrically connected to the active layer 27. The array substrate further comprises a gate insulation layer 28 and an etch stop layer 29.

Figure 4C:
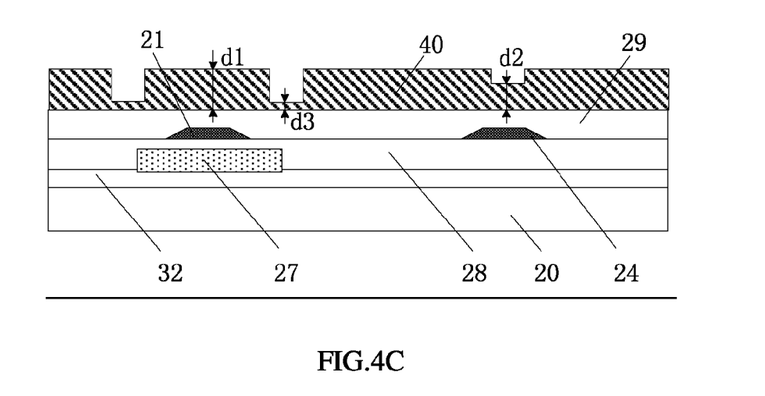
FIG. 4C is a cross section illustrating a photoresist having a first thickness, a second thickness and a third thickness after gray-scale exposure in accordance with an embodiment of the invention.

It is seen from FIG. 4A and FIG. 4B that the etching depth of the contact via hole 31 electrically connecting the drain electrode 22 and the source electrode 23 of the first TFT as well as the drain electrode 25 and the source electrode 26 of the second TFT to the active layer 27 is the largest. The exposed photoresist 40 (as illustrated in FIG. 4C) at the contact via hole 31 is of the third thickness d3 in the fabrication method and may be zero. The etching depth of the connection via hole 30, which electrically connects the drain electrode of the first TFT to the gate electrode of the second TFT, is the second largest. The exposed photoresist 40 at the connection via hole 30 in the fabrication method is of the second thickness d2. The exposed photoresist 40 at positions corresponding to the gate electrode 21 or other positions with no need to form a via hole is of the first thickness d1.

For the top-gate TFT having a 2T1C configuration, photoresist of different thicknesses is applied to positions corresponding to different via holes, in accordance with different etching depths of the connection via hole connecting the drain electrode of the first TFT (the switch TFT) to the gate electrode of the second TFT (the drive TFT) and the contact via hole connecting the source/drain electrode of the TFT to the active layer, to prevent the over etching of via holes with smaller depth. As a result, current leakage caused by the electrical connection between the source/drain electrode metal and the gate electrode metal due to the break of the active layer and gate insulation layer caused by over etching is prevented, thereby increasing the defect-free rate of TFT fabrication.

This application claims the priority of Chinese Application No. 201310741939.9, filed on Dec. 27, 2013 and which application is incorporated herein by reference.

What is described above is related to the illustrative embodiments of the disclosure only and not limitative to the scope of the disclosure; the scopes of the disclosure are defined by the accompanying claims.

What is claimed is:

1. A method for fabricating an array substrate, comprising:
   providing a substrate, wherein a first metal layer, a gate insulation layer and an active layer are formed on the substrate, and the first metal layer comprises patterns of a gate electrode of a first TFT and a gate electrode of a second TFT;
   forming an etch stop layer film on the substrate;
   applying a photoresist to the etch stop layer film, gray-scale exposing and developing the photoresist to form a first region having a first thickness, a second region having a second thickness and a third region having a third thickness, wherein the first thickness, the second thickness and the third thickness are not equal to each other, and the first thickness is larger than the second and third thicknesses;
   forming, through a patterning process, a pattern of an etch stop layer in the first region, a connection via hole for connecting a drain electrode of the first TFT to the gate electrode of the second TFT in the second region, and a contact via hole for connecting respective source electrode and drain electrode of each of the first and second TFTs to the active layer in the third region; and
   forming a second metal layer film on the substrate done with the previous steps, forming a source electrode and a drain electrode of the first TFT, as well as a source electrode and a drain electrode of the second TFT through a patterning process, wherein the source electrode and the drain electrode of each of the first and second TFTs are respectively electrically connected to the active layer by way of the contact via hole, and the drain electrode of the first TFT is electrically connected to the gate electrode of the second TFT by way of the connection via hole; wherein both the first TFT and the second TFT are top-gate TFTs.

2. The method of claim 1, wherein the formation of the first metal layer, the gate insulation layer and the active layer comprises:
   forming an active layer film on the provided substrate, and forming a pattern comprising the active layer through a patterning process;
   forming the gate insulation layer on the substrate done with the previous step; and
   forming a first metal film on the substrate done with the previous step, and forming a pattern of a gate electrode metal layer comprising the gate electrode of the first TFT and that of the second TFT through a patterning process.

3. The method of claim 1, wherein the second thickness is larger than the third thickness.

4. The method of claim 3, wherein the third thickness is zero.

5. The method of claim 1, wherein the step of gray-scale exposing and developing the photoresist to form a first region having a first thickness, a second region having a second thickness and a third region having a third thickness comprises:
   exposing the photoresist to form the first region, the second region and the third region by utilizing a gray-scale exposing light source, or a plurality of light sources with different exposure intensities, or a plurality of masks.

6. The method of claim 1, wherein the pattern of the etch stop layer is formed from the etch stop layer film under the first region.

7. The method of claim 1, wherein the connection via hole is formed in the etch stop layer film under the second region and penetrates through the etch stop layer film.

8. The method of claim 1, wherein the contact via hole is formed in the etch stop layer film and the gate insulation layer under the third region and penetrates through the etch stop layer film and the gate insulation layer.

9. The method of claim 2, wherein the second thickness is larger than the third thickness.

10. The method of claim 9, wherein the third thickness is zero.

* * * * *